United States Patent
Iwata

(10) Patent No.: US 7,887,873 B2
(45) Date of Patent: Feb. 15, 2011

(54) GASIFICATION MONITOR, METHOD FOR DETECTING MIST, FILM FORMING METHOD AND FILM FORMING APPARATUS

(75) Inventor: Teruo Iwata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 599 days.

(21) Appl. No.: 11/797,740

(22) Filed: May 7, 2007

(65) Prior Publication Data

US 2007/0212485 A1 Sep. 13, 2007

Related U.S. Application Data

(62) Division of application No. 10/892,456, filed on Jul. 16, 2004, now Pat. No. 7,238,238.

(30) Foreign Application Priority Data

Jul. 17, 2003 (JP) .............................. 2003-276058

(51) Int. Cl.
C23C 16/32 (2006.01)
C23C 16/00 (2006.01)
(52) U.S. Cl. ...................................... 427/8; 427/248.1
(58) Field of Classification Search ............... 427/8, 427/248.1
See application file for complete search history.

(56) References Cited

U.S. PATENT DOCUMENTS 5,476,002 A * 12/1995 Bowers et al. ............. 73/24.01
6,244,575 B1 * 6/2001 Vaartstra et al. ............. 261/141

FOREIGN PATENT DOCUMENTS

JP 2001-148347 5/2001

OTHER PUBLICATIONS

Elam et al., Viscous flow reactor with quartz crystal microbalance for thin film growth by atomic layer deposition, Aug. 2002, Review of Scientific Instruments, 73(8), pp. 2981-2987.*
Omega, Transactions in Measurement and Control, 1998, Putnam Publisting Company and Omega Press LLC, vol. 3:Force-related measurements, pp. 44-45.*
Bowers, Rev. Sci. Instrum. 62 (6), Jun. 1991, pp. 1624-1629.

* cited by examiner

Primary Examiner—Timothy H Meeks
Assistant Examiner—Kelly M Gambetta
(74) Attorney, Agent, or Firm—Smith, Gambrell & Russell, LLP

(57) ABSTRACT

A deposition apparatus supplies a reactive gas obtained by vaporizing a liquid material at a vaporizer 30 into a chamber 10 via a processing-gas pipe 40 and forms a thin film on a semiconductor wafer W due to a thermal decomposition of the reactive gas. The deposition apparatus is provided, in the processing-gas pipe 40, with a crystal gauge 51 detecting a pressure Pq under the influence of mist in the reactive gas and a capacitance manometer 52 detecting a pressure Pg under no influence of the mist. The apparatus further includes a gasification monitor 50 detecting a quantity of mist in the reactive gas on the basis of a difference ΔP between the pressure Pq and the pressure Pg measured by the crystal gauge 51 and the capacitance manometer 52 in order to prevent deposition defects due to the mist in the reactive gas.

5 Claims, 5 Drawing Sheets

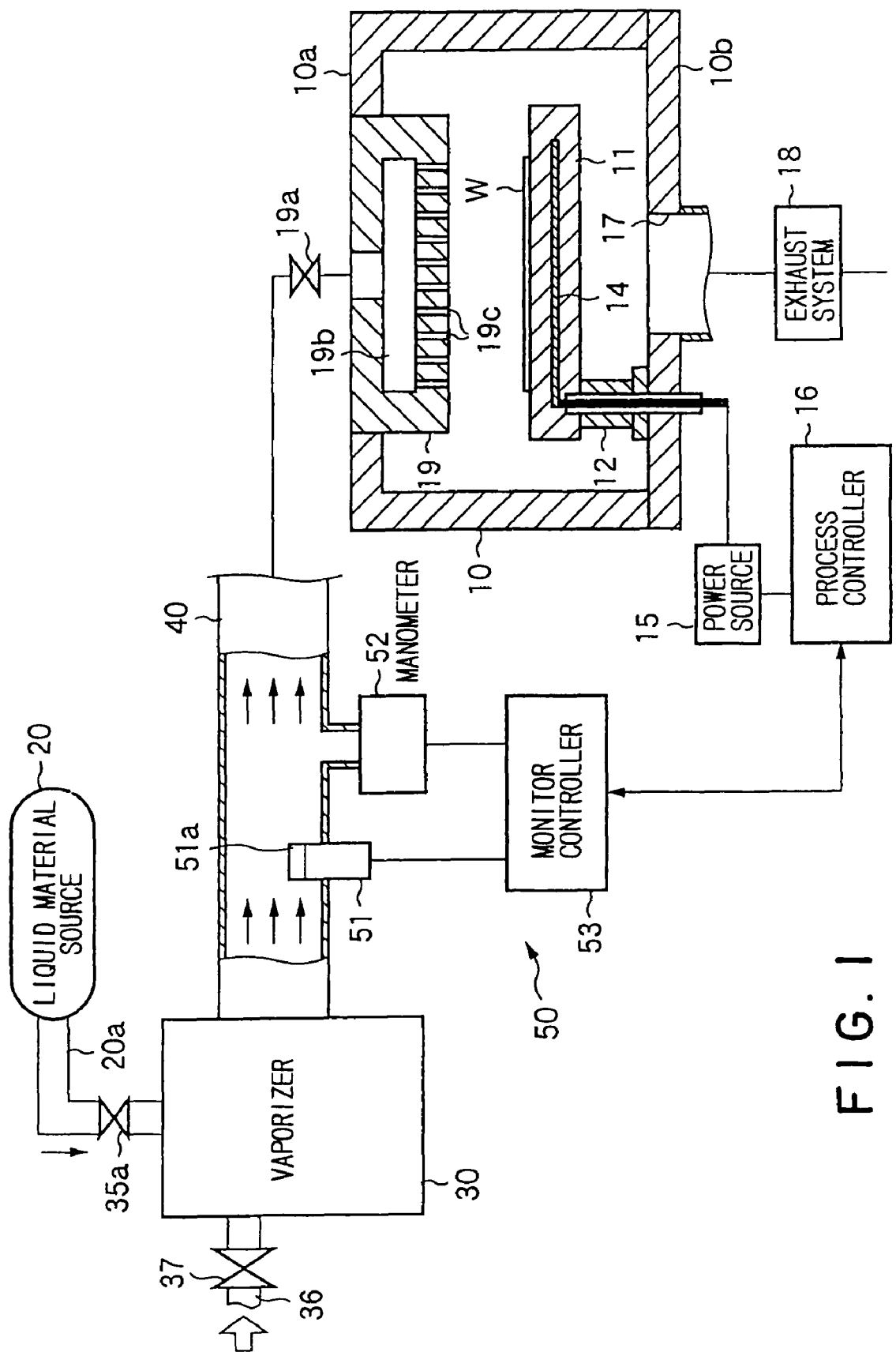
F I G. 1

GASIFICATION MONITOR, METHOD FOR DETECTING MIST, FILM FORMING METHOD AND FILM FORMING APPARATUS

CROSS-REFERENCE TO RELATED APPLICATION

This application is a divisional of Ser. No. 10/892,456, filed Jul. 16, 2004, now U.S. Pat. No. 7,238,238 which is being incorporated in its entirety herein by reference.

BACKGROUND OF THE INVENTION

1. Field of the Invention

This invention relates to a gasification monitor, a method for detecting mist, a film forming method and a film forming apparatus, which are applicable to a technique where, for example, a liquid material or a solid material is vaporized and supplied into a chamber to perform a designated processing, such as chemical vapor deposition (CVD).

2. Background Art

In order to manufacture a desired semiconductor device, generally, there are repeatedly carried out a film deposition process and a pattern etching process against a semiconductor wafer. With high integration and high-density of semiconductor devices, the specifications of deposition technique are becoming increasingly severe every year. For instance, even for an oxidation film of great thinness (e.g. insulation film, gate insulation film, etc. of a capacitor in a device), an electrode film and a wiring film, it is required to reduce the film-thickness of these films furthermore. Giving an example of a gate insulation film, a method for forming $HfO_2$-film, $ZrO_2$-film, $SiO_2$-film by MOCVD (Metal Organic Chemical Vapor Deposition) method is proposed. In the above method, organic metallic compounds, such as $Hf(OtBu)_4$, $Zr(OtBu)_4$ and $SiH(NMe_2)_3$, are used as deposition materials. However, it should be noted that all of these materials are liquids at ambient temperatures and have respective vapor pressures of relative lowness at temperatures less than their resolving temperatures. Therefore, Japanese Unexamined Patent Publication (kokai) No. 2001-148347 discloses a method where these materials are vaporized in a vaporizer and continuously, the resultant vapor is introduced, as a processing gas, into a deposition chamber for film deposition due to the thermal decomposition of the vapor.

In the MOCVD method mentioned above, there is a worry that if the evaporation of liquid material is incomplete in the vaporizer, the liquid material in the form of mist in a processing gas is transported the chamber, so that the liquid materials may adhere to a thin film on a substrate.

Meanwhile, the vaporizer disclosed in the above publication (kokai) No. 2001-148347 is provided with a variety of ingenious plans in order to perform its vaporization effectively. Nevertheless, the same publication (kokai) No. 2001-148347 does not make arrangements to detect the mist included in the processing gas to be supplied into the chamber. Thus, it is impossible to detect deposition defects due to the mist unless a thin film has been deposited on a substrate practically.

Additionally, since it takes a long time to inspect defects after the deposition, it is difficult to take prompt measures to meet the situation, causing the productivity of a deposition process to be lowered.

SUMMARY OF THE INVENTION

In the above-mentioned situation, it is an object of the present invention to provide a technique enabling a prevention of film forming defects due to mist contained in the processing gas etc.

Further, it is another object of the present invention to provide a technique enabling an improvement of the productivity of a film forming process where a film forming is carried out by a processing gas produced in a vaporizer.

In order to solve the above-mentioned objects, the first feature of the present invention resides in the provision of a gasification monitor arranged in a gas feeding path between a vaporizer for vaporizing a liquid material or a solid material to producing a processing and a processing part where the processing gas is used, the gasification monitor detecting a quantity of mist contained in the processing gas.

The second feature of the invention resides in the provision of a mist detecting method for detecting mist contained in a gas, comprising the steps of: detecting a first pressure Pq of the gas, which is changeable by a quantity of mist contained in the gas, by a first method; detecting a second pressure Pg of the gas, which is unchangeable by the quantity of mist contained in the gas, by a second method; and detecting the quantity of mist contained in the gas on a basis of a difference ΔP between the first pressure Pq detected by the first method and the second pressure Pg detected by the second method.

The third feature of the invention resides in the provision of a film forming method for forming a thin film on an object to be processed by thermally decomposing a processing gas obtained by vaporizing a liquid material or a solid material, the film forming method comprising the steps of: monitoring a quantity of mist contained in the processing gas; and controlling vaporizing conditions of the liquid material or the solid material in a manner that the quantity of mist decreases.

The fourth feature of the invention resides in the provision of a film forming method for forming a thin film on an object to be processed by thermally decomposing a processing gas obtained by vaporizing a liquid material or a solid material, the film forming method comprising the steps of: monitoring a quantity of mist contained in the processing gas; and either outputting a warning or stopping a deposition process when the quantity of mist exceeds a predetermined threshold value.

The fifth feature of the invention resides in the provision of a film forming apparatus comprising: a processing part for forming a thin film on an object to be processed by use of a processing gas; a vaporizer for vaporizing a liquid material or a solid material to supply the processing part with the processing gas; and a gasification monitor arranged in a gas feeding path for the processing gas between the vaporizer and the processing part, for detecting a quantity of mist contained in the processing gas.

In the first to fifth aspects of the present invention, as the detecting means for detecting the quantity of mist contained in the processing gas, it is possible to adopt a gasification monitor including: a first pressure gauge for detecting the pressure Pq of the processing gas by use of a fact that a impedance of the oscillator arranged in the processing gas changes dependently of the pressure of the processing gas, a second pressure gauge for detecting the pressure Pg of the processing gas on a basis of a deformation of the pressoreceptive part subjected to the pressure of the processing gas, and a control part for detecting the quantity of mist contained in the processing gas on a basis of a difference ΔP between the first pressure Pq detected by the first pressure gauge and the second pressure Pg detected by the second pressure gauge.

Further, as the first pressure gauge, it is possible to adopt a crystal gauge that detects the first pressure Pq of the processing gas by using a quartz oscillator as the oscillator. As the second pressure gauge, it is possible to adopt a capacitance manometer that includes a diaphragm as the pressoreceptive part and electrodes opposing the diaphragm and that detects the second pressure Pg of the processing gas by detecting a deformation of the diaphragm in the form of a change in electrostatic capacity between the diaphragm and the electrodes.

Thus, utilizing a fact that a change in pressure of the environment about the first pressure gauge allows a friction between the quartz oscillator and a gaseous molecule to be changed so that an impedance of oscillation of the quartz oscillator varies, the crystal gauge (as the first pressure gauge) measures the change in impedance of oscillation and further converts it to a pressure. Therefore, if a mist larger than the gaseous molecule is present, then the friction between the quarts oscillator and the gaseous molecule with the mist causes the crystal gauge to detect a value larger than an actual pressure in proportion to a quantity of the mist.

On the other hand, in the capacitance manometer (as the second pressure gauge), even if a mist is contained in a gas to be measured, there is no change in measured values of pressure since the capacitance manometer is constructed so as to detect a pressure due to a deformation of the diaphragm.

Accordingly, if only calibrating the operations of both of the crystal gauge and the capacitance manometer so that, in the absence of mist, their measured values are identical to each other within a desired measurement range, then it becomes possible to measure the quantity of mist by calculating a difference between their measured values.

In the first and fifth aspects of the present invention, the processing part is adapted so as to form a thin film on an object to be processed by use of a thermal decomposition of the processing gas.

In the fifth aspect of the present invention, the film forming apparatus further comprises a process controller that controls at least either one of the operation of the vaporizer and the operation of the processing part, on a basis of the quantity of mist obtained by the gasification monitor.

In the first to fifth aspects of the present invention, the processing gas is an organic metallic compound.

In this way, according to the present invention, it is possible to measure a quantity of mist contained in the processing gas in situ. Therefore, if performing various controls, for example, a control where the measured result of the quantity of mist is fed back to the controls of various vaporizing conditions in the vaporizer, thereby suppressing the quantity of mist to a low value causing no film forming defect, a control where an outside operator is informed of the occurrence of mist, a control where the film forming process is automatically stopped when the quantity of mist is more than a predetermined threshold value, etc., then it becomes possible to prevent an occurrence of film forming defects due to the mist contained in the processing gas, certainly.

Consequently, it becomes possible to measure the film forming defects quickly in comparison with a countermeasure where an object to be processed is inspected after the film forming process in order to detect film forming defects due to mist, whereby the productivity at the film forming process can be improved.

According to the present invention, it is possible to prevent an occurrence of film forming defects due to mist contained in the processing gas or the like. Additionally, it is possible to improve the productivity of a film forming process using a processing gas produced in a vaporizer.

These and other objects and features of the present invention will become more fully apparent from the following description and appended claims taken in conjunction with the accompany drawings.

BRIEF DESCRIPTION OF THE DRAWINGS

FIG. 1 is a sectional view showing a deposition apparatus to carry out a deposition method in accordance with an embodiment of the present invention;

DESCRIPTION OF THE PREFERRED EMBODIMENT

Figure 2:
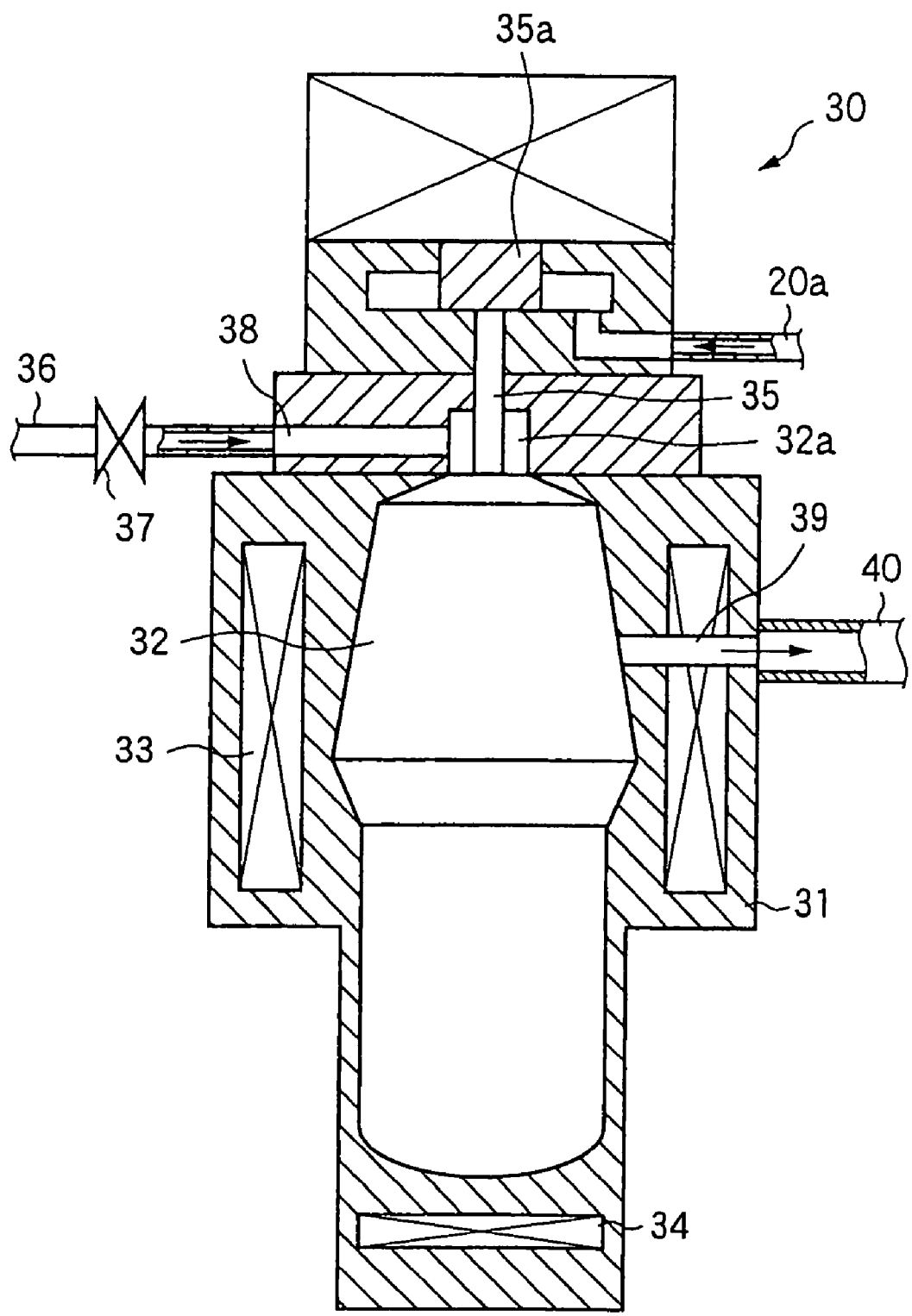
FIG. 2 is a sectional view showing one example of a vaporizer of the deposition apparatus of the embodiment of the present invention.

An embodiment of the present invention will be described with reference to accompanying drawings.

FIG. 1 illustrates a deposition apparatus for carrying out a deposition method in accordance with one embodiment of the present invention. By way of example, the deposition apparatus is provided to form a HF (hafnium) oxidation film by means of CVD (chemical vapor deposition). The deposition apparatus includes a chamber 10 forming a processing part of the apparatus, a liquid-material source 20 for supplying a liquid material containing HF, a vaporizer 30 for vaporizing the liquid material from liquid-material source 20 to produce a processing gas and a processing-gas pipe (gas feeding path) 40 for introducing the so-produced processing gas into the chamber 10.

The chamber 10 is cylindrical-shaped and constructed so as to allow its pumping to a vacuum. Disposed in the chamber 10 is a susceptor 11 that supports a semiconductor wafer W as an object to be processed, horizontally. In the chamber 10, the susceptor 11 is supported by a plurality of cylindrical support members 12 (only one shown in the figure). A heater 14 is embedded in the susceptor 11. By electricity supplied from a power source 15, the heater 14 is capable of heating the semiconductor wafer W as the object to be processed, to a predetermined temperature. A process controller 16 is connected to the power source 15. Consequently, corresponding to signals from a temperature sensor (not shown), the output to the heater 14 is controlled by the process controller 16.

An exhaust port 17 is formed in a bottom wall 10b of the chamber 10. The exhaust port 17 is connected to an exhaust system 18. By the exhaust system 18, the chamber 10 can be depressurized to a designated vacuum.

A shower head 19 is attached to a top wall 10a of the chamber 10. The processing-gas pipe 40 is connected to the shower head 19 through a feed control valve 19a. With such an arrangement, the processing gas vaporized in the vaporizer 30 is introduced into the shower head 19. The shower head 19 is provided with an inner space 19b. Additionally, the shower head 19 is provided, on its surface opposing the susceptor 11, with a number of gas discharging holes 19c. Thus, reactive gas introduced into the inner space 19b of the shower head 19 through the processing-gas pipe 40 is discharged from the gas discharging holes 19c to the semiconductor wafer W on the susceptor 11.

As illustrated in FIG. 2, the vaporizer 30 of this embodiment includes a main body 31 defining a vaporizing space 32 therein, a vaporizing heater 33 and a vaporizing heater 34 both arranged so as to surround the vaporizing space 32. A vaporizing nozzle 35 is arranged at one end of the vaporizing space 32 coaxially. The vaporizing nozzle 35 is connected to the liquid-material source 20 through a material flow-control valve 35a and a material pipe 20a.

A nozzle space 32a is formed in the circumference of the tip of the vaporizing nozzle 35. Communicated with the nozzle space 32a is a carrier-gas passage 38 that is connected to an exterior carrier-gas source through a carrier-gas pipe 36 and a carrier-gas control valve 37.

In the lateral part of the main body 31, a gas passage 39 is formed to communicate the vaporizing space 32 with the processing-gas pipe 40.

In operation, the introduction of carrier gas, such as nitrogen gas, into the nozzle space 32a while spraying the liquid material into the vaporizing space 32 via the vaporizing nozzle 35 allows the liquid material to be dispersed in the vaporizing space 32 and vaporized into reactive gas. Then, the reactive gas is mixed with the carrier gas and the resultant processing gas is transferred from the gas passage 39 to the processing-gas pipe 40.

In the vaporizer 30, according to the situations, there is a possibility that the liquid material vaporizes incompletely. Consequently, part of the liquid material is changed to fine mist and transferred to the processing-gas pipe 40 and the chamber 10, together with the material gas. However, according to the embodiment, a later-mentioned gasification monitor 50 can detect the above mist in situ.

Here, it is noted that the "mist" in this specification does mean not only an element maintaining a micro-droplet condition as the result that the liquid has been vaporized incompletely or vaporized gas has been liquefied again but liquid and solid elements that may be produced in the vaporizer or on the downstream side of the vaporizer.

The liquid-material source 20 stores the liquid material containing Hf, for example, HTB (Hf(OtBu)$_4$) or TDMAH (Hf(NMe$_2$)$_4$) as being an organic metallic compound containing hafnium and delivers the liquid material to the vaporizer 30 through the material pipe 20a by appropriate means.

All of these organic metallic compounds are liquids at ambient temperatures and have respective vapor pressures of relative lowness at temperatures less than their resolving temperatures. Therefore, it is carried out to vaporize these materials by the vaporizer 30. For instance, in case of Hf(OtBu)$_4$ or Hf(NMe$_2$)$_4$, the material is heated to about 60° C. for its evaporation to produce the reactive gas.

In this embodiment, the above-mentioned process controller 16 controls all related to the chamber 10, the operations of the power source 15, the exhaust system 18 and the feed control valve 19a, the operations of the carrier-gas control valve 37 and the material flow-control valve 35a on the side of the vaporizer 30 and the heating temperatures of the vaporizing heaters 33 and 341 etc. Consequently, the process controller 16 has a function to control all the deposition processes described later.

The gasification monitor 50 is arranged in the course of the processing-gas pipe 40. The gasification monitor 50 includes a crystal gauge (first pressure gauge) 51, a capacitance manometer (second pressure gauge) 52 and a monitor controller 53.

Figure 5:
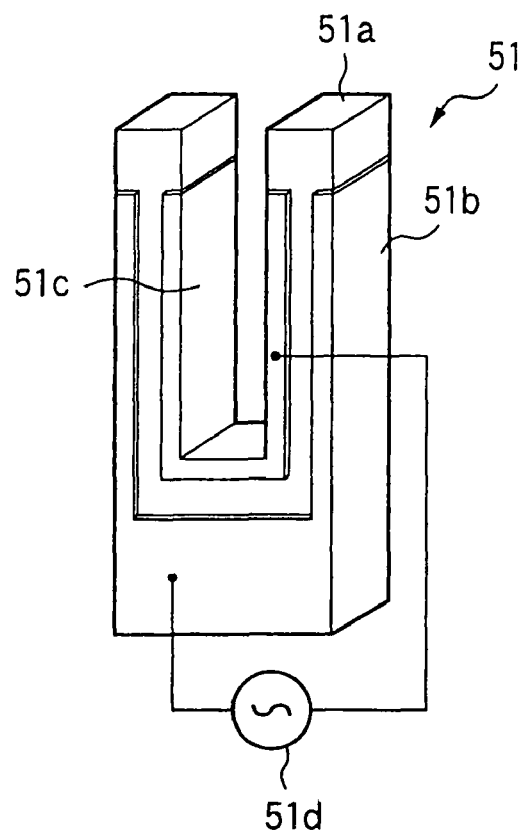
FIG. 5 is a perspective view showing one example of a crystal gauge forming the gasification monitor of the deposition apparatus of the embodiment of the present invention.

As illustrated in FIG. 5, the crystal gauge 51 is formed by a U-shaped quartz oscillator 51a, electrodes 51b and 51c arranged so as to interleave the quartz oscillator 51a and a wave generator 51d for impressing high frequency waves to the electrodes 51b and 51d. Making use of a fact that the resonant impedance of the quartz oscillator 51a depends on its friction with gaseous molecules (gas pressure), the crystal gauge 51 detects a first pressure Pq of the processing gas in the processing-gas pipe 40 due to a change in impedance and further outputs the so-detected pressure Pq to the monitor controller 53.

Figure 6:
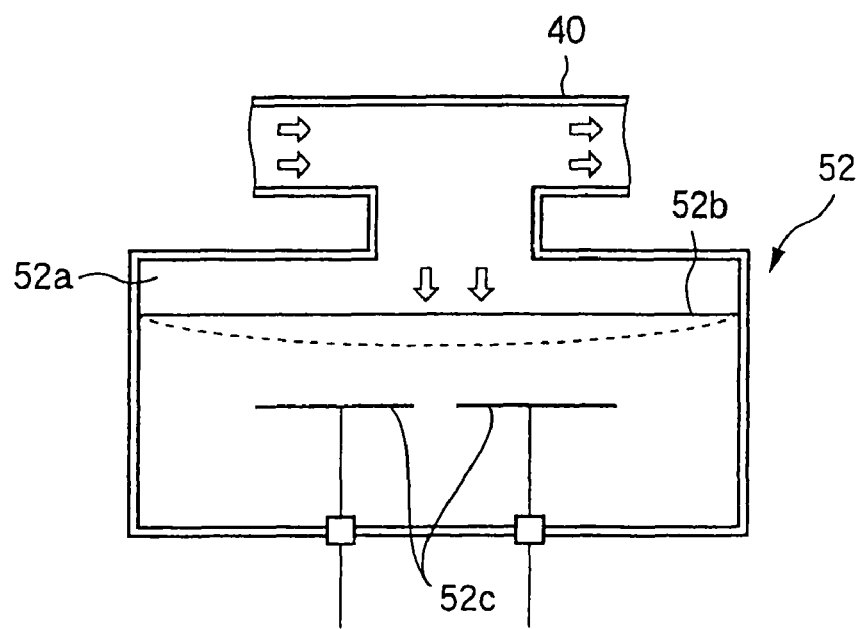
FIG. 6 is a sectional view showing one example of a capacitance manometer forming the gasification monitor of the deposition apparatus of the embodiment of the present invention.

As illustrated in FIG. 6, the capacitance manometer 52 is formed by a diaphragm 52b arranged in a pressoreceptive chamber 52a to make a displacement (deformation) on receipt of the pressure of the processing gas in the processing-gas pipe 40 and a plurality of fixed electrodes 52c opposed to the diaphragm 52b to detect its displacement (deformation) corresponding to the gas pressure, in the form of a capacity change. Thus, the capacitance manometer 52 is constructed so as to measure a second pressure Pg of the processing gas by the displacement of the diaphragm 52b.

Meanwhile, due to the above-mentioned measurement principle, if the processing gas contains mist larger than the gaseous molecule, the crystal gauge 51 is subjected to adhesion of the mist to the quartz oscillator 51a, so that the impedance is increased that much. Consequently, the crystal gauge 51 outputs a pressure Pq larger than the actual pressure.

On the contrary, in the capacitance manometer 52, even if the processing gas contains mist larger than the gaseous molecule to cause adhesion of the mist to the diaphragm 52b, the adhesion does not influence the deflection of the diaphragm 52b. Thus, there is no change in measured values of the pressure Pg of the processing gas.

Therefore, it is possible to regard a difference $\Delta P$ between the pressure Pq detected by the crystal gauge 51 and the pressure Pg detected by the capacitance manometer 52 as a parameter representing the quantity of mist contained in the processing gas. According to this embodiment, the monitor controller 53 calculates the above difference $\Delta P$ and further outputs it to the process controller 16 where the later-mentioned operations of the deposition process are carried out.

One example of the operations will be described below.

Figure 3:
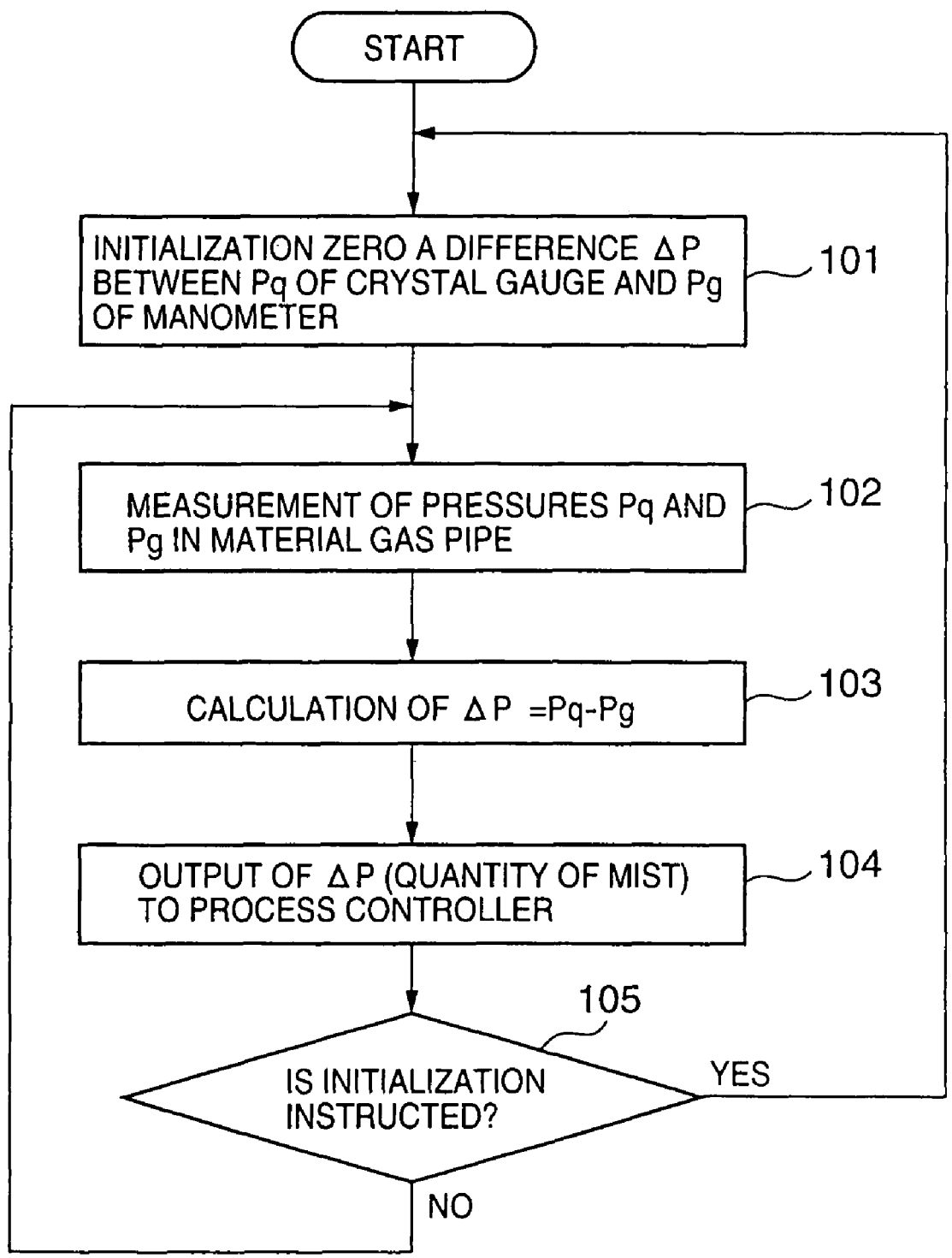
FIG. 3 is a flow chart showing one example of the operation of a gasification monitor in the deposition apparatus of the embodiment of the present invention.

First, the operation of the gasification monitor 50 will be described with reference to a flow chart of FIG. 3.

At step 101, the monitor controller 53 carries out an initialization to calibrate measured values appropriately so as to bring a difference $\Delta P$ between the pressure Pq detected by the crystal gauge 51 and the pressure Pg detected by the capacitance manometer 52 back to zero. In this embodiment, since there is no need to detect an absolute measurement value of the pressure, the above calibration is accomplished, for example, by deleting or adding either a measured value of the former pressure Pq or another measured value of the latter pressure Pg thereby bringing the difference $\Delta P$ back to zero.

After the calibration, at step 102, it is executed to receive a pressure Pq (measured value) from the crystal gauge 51 and another pressure Pg (measured value) from the capacitance manometer 52. Next, at step 103, it is executed to calculate a difference $\Delta P$. Then, the so-obtained difference $\Delta P$ is transmitted to the process controller 16 at step 104. At next step 105, it is judged whether the initialization is instructed from the process controller 16 or not. If the instruction is present (Yes), then the processes at step 101 and the subsequent steps 102 to 104 are carried out repeatedly. While, if the instruction is absent (No at step 105), the processes at step 102 and the sequent steps 103 and 104 are carried out repeatedly.

Figure 4:
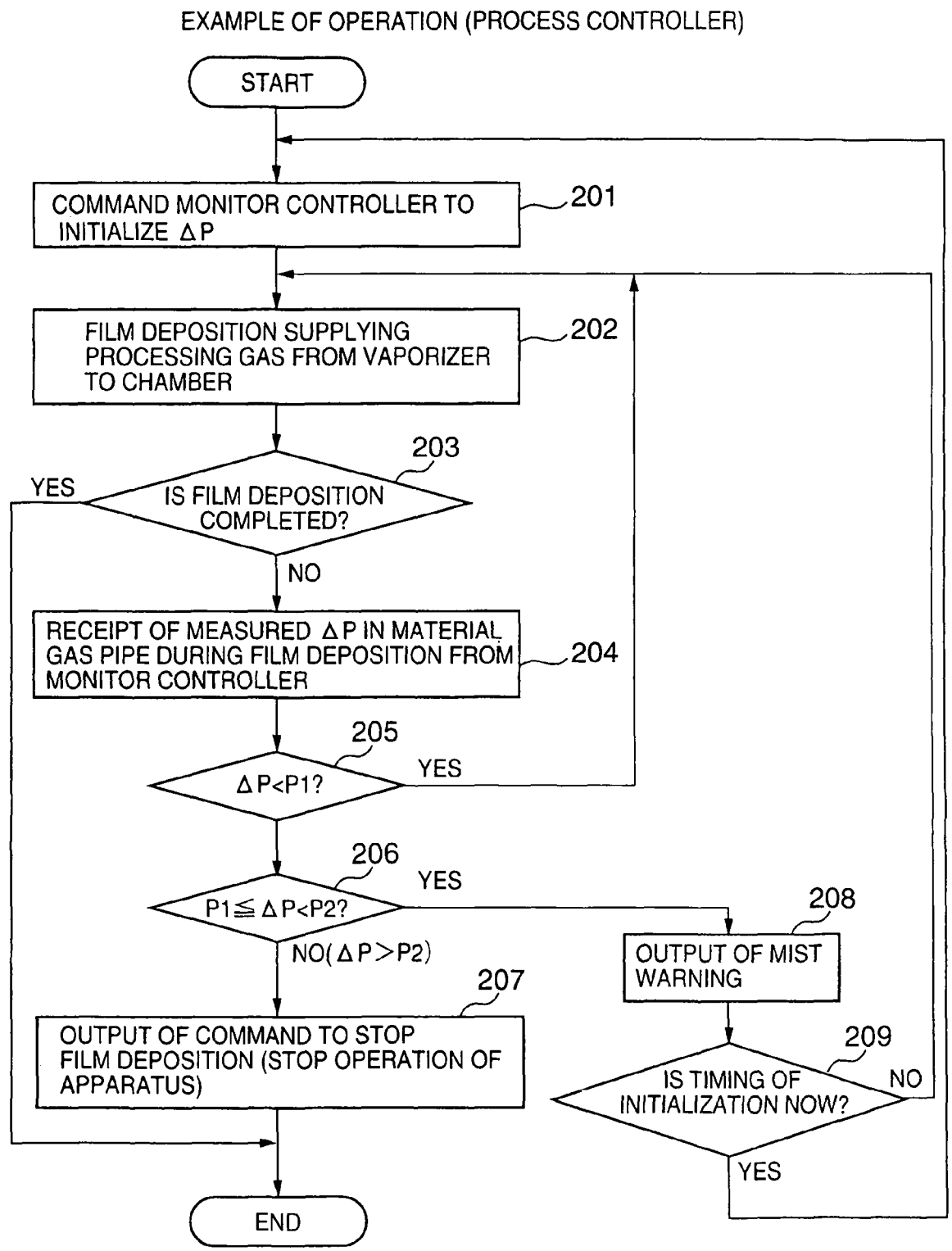
FIG. 4 is a flow chart showing one example of the operation of a process controller in the deposition apparatus of the embodiment of the present invention.

On the other hand, as illustrated in FIG. 4, the process controller 16 commands to allow the monitor controller 53 of the gasification monitor 50 to perform the initialization at step 201. Thereafter, when it is detected that a semiconductor wafer W is loaded into the chamber 10 and mounted on the susceptor 11, the process controller 16 controls the carrier-gas control valve 37 and the material flow-control valve 35a about the vaporizer 30 while depressurizing the chamber 10 by the exhaust system 18, thereby producing a predetermined flow of processing gas consisting of the reactive gas obtained by vaporizing the liquid material and the carrier gas. Continuously, the feed control valve 19a is opened to introduce the so-produced processing gas into the chamber 10 via a number of gas discharging holes 19c of the shower head 19.

During the above process, since the semiconductor wafer W is heated up to a temperature more than the resolving temperature of the reactive gas by the heater 14 embedded in the susceptor 11, the reactive gas is dissolved on the surface of the semiconductor wafer W, so that the deposition of a Hf-oxidation film is progressed on the semiconductor wafer W (step 202).

At next step 203, it is judged whether the deposition has been completed or not. When the judgment at step 203 is No, the routine goes to step 204 to receive the calculation result of a difference $\Delta P$ (i.e. quantity of mist) in the processing-gas pipe 40 from the monitor controller 53. At next step 205, it is first judged whether the difference $\Delta P$ is less than a first threshold value P1 or not. Note, the first threshold value P1 is an upper limit (i.e. upper pressure value) on the quantity of mist that could not cause deposition defects. If the difference $\Delta P$ is less than the first threshold value P1 ($\Delta P<P1$, Yes at step 205), the routine goes to step 202 to continue the deposition process.

If the judgment at step 205 is No, that is, the difference $\Delta P$ is not less than the first threshold value P1 ($P1 \leq \Delta P$), the routine goes to step 206 where it is judged whether the difference $\Delta P$ is less than a second threshold value P2 ($P1 \leq \Delta P<P2$) or not. Note, the second threshold value P2 is a (pressure) value corresponding to the quantity of mist where it is expected that critical deposition defects are produced certainly and therefore, the deposition should be cancelled. Thus, when the difference $\Delta P$ exceeds the second threshold value P2, the routine goes to step 207 to bring the operation of the deposition apparatus to standstill for stoppage of the deposition process.

When the difference $\Delta P$ is less than the second threshold value P2 ($P1 \leq \Delta P<P2$, Yes at step 206), the routine goes to step 208 to output a warning indicating the mist being mixed in the processing gas against an outside operator for equipments or the like. At next step 209, it is judged whether the present time is a momentum to carry out the above-mentioned initialization of the difference $\Delta P$ at the gasification monitor 50 or not. In case of carrying out the initialization of the difference $\Delta P$ at the gasification monitor 50, the routine returns to step 201 to instruct the initialization of the difference $\Delta P$ to the gasification monitor 50 (i.e. execution of step 101 of FIG. 3). While, if the present time is not a momentum to carry out the above-mentioned initialization, the routine goes to step 202 to continue the deposition process until the completion of the deposition process (Yes at step 203). Note, when the deposition process is completed, the routine is ended.

In an actual deposition, there is a case that the vaporizer 30 is intermittently operated during the deposition process in order to supply the processing gas intermittently. In such a case, it is possible to accomplish the initialization at the gasification monitor 50 at the timing that the processing gas does not contain the reactive gas but the carrier gas only.

In the above-mentioned embodiment, the output of a warning to the outside is representative of the operation at step 208. Alternatively, the operation at step 208 may be replaced by a feedback control where the quantity of mist detected by the gasification monitor 50 is reduced less than the desirable value P1 on the adjustment of the opening degrees of the material flow-control valve 35a and the carrier-gas control valve 37 about the vaporizer 30 in order that the quantity of mist can be usually maintained less than the desirable value P1 during the deposition process.

As mentioned above, according to the embodiment, the gasification monitor 50 monitors the quantity of mist ($\Delta P$) contained in the processing gas supplied to the chamber 10 during the deposition process, at real-time. Therefore, if performing various controls, for example, a control where the measured result of the quantity of mist ($\Delta P$) is fed back to the controls of various vaporizing conditions [e.g. flow rate of carrier gas (opening degree of the carrier-gas control valve 37), feed rate of the liquid material (opening degree of the material flow-control valve 35a), heating temperatures of the vaporizing heaters 33, 34] in the vaporizer 30, thereby suppressing the quantity of mist to a low value causing no deposition defect; a control where an outside worker is informed of the occurrence of mist; a control where the deposition process is automatically stopped when the quantity of mist is more than a predetermined threshold value, etc., then it becomes possible to prevent an occurrence of deposition defects due to the mist contained in the processing gas.

Consequently, it becomes possible to measure the deposition defects quickly in comparison with a countermeasure for deposition defects due to mist by inspecting a semiconductor wafer W after the deposition process, whereby the productivity at the deposition process can be improved.

Without being limited to the above-mentioned embodiment, the present invention may be modified variously. For instance, although either $Hf(OtBu)_4$ or $Hf(NMe_2)_4$ is employed as the liquid material containing Hf in the above-mentioned embodiment, the same Hf material is not restricted to these compounds only.

Further, although the present invention is applied to the CVD deposition of Hf in the above-mentioned embodiment, the deposition material is not necessarily limited to an element Hf. For example, the present invention is applicable to the CVD depositions of Zr, Si, Cu, Al, etc. by use of the following liquid materials of HTB ($Zr(OtBu)_4$), TDMAS ($SiH(NMe_2)_3$), TEOS($Si(OCH_2CH_3)_4$), Cu(hfac)TMVS, Cu(hfac)ATMS, TMA($Al(CH_3)_3$), etc. Further, so long as a processing is carried out by using gas produced by vaporizing the liquid material, the present invention is applicable to the other film forming processes without being limited to the deposition process, such as CVD.

Regarding the vaporizer, not apply only to one that sprays the liquid material into the carrier gas to produce the reactive gas, the vaporizer may be constructed so as to vaporize a liquid material by heat. Alternatively, it may be constructed so as to produce the reactive gas due to sublimation of a solid material.

Finally, it will be understood by those skilled in the art that the foregoing descriptions are nothing but one embodiment of the disclosed gasification monitor, the method for detecting mist, the deposition method and the deposition apparatus and therefore, various changes and modifications may be made within the scope of claims.

What is claimed is:

1. A film forming method for forming a thin film on an object to be processed by thermally decomposing a processing gas obtained by vaporizing a liquid material or a solid material, the film forming method comprising the steps of:
   supplying the liquid material or the solid material from a source;
   vaporizing the liquid material or the solid material to provide a processing gas;
   conducting the processing gas to a processing chamber where the thin film is to be formed on the object to be processed;
   while conducting the processing gas to the processing chamber, monitoring a quantity of mist contained in the processing gas by
   detecting a first pressure Pq of the processing gas by a first method and producing a pressure measurement which is changeable by a quantity of mist contained in the gas,
   detecting a second pressure Pg of the processing gas by a second method and producing a second pressure measurement, which is unchangeable by the quantity of mist contained in the gas, by using a pressure detecting part that produces a pressure measurement which does not change when mist contained in the processing gas adheres to the pressure detecting part, the pressure detecting part being disposed such that the mist can adhere to it, and
   detecting the quantity of mist contained in the processing gas based on a difference ΔP between the first pressure Pq detected by the first method and the second pressure Pg detected by the second method;
   performing a film forming process in the processing chamber while the detected quantity of mist remains below a threshold value; and
   controlling vaporizing conditions of the liquid material or the solid material so as to decrease the quantity of mist.

2. A film forming method for forming a thin film on an object to be processed by thermally decomposing a processing gas obtained by vaporizing a liquid material or a solid material, the film forming method comprising the steps of:
   supplying the liquid material or the solid material from a source;
   vaporizing the liquid material or the solid material to provide a processing gas;
   conducting the processing gas to a processing chamber where the thin film is to be formed on the object to be processed;
   while conducting the processing gas to the processing chamber, monitoring a quantity of mist contained in the processing gas by
   detecting a first pressure Pq of the processing gas by a first method and producing a pressure measurement which is changeable by a quantity of mist contained in the gas,
   detecting a second pressure Pg of the processing gas by a second method and producing a second pressure measurement, which is unchangeable by the quantity of mist contained in the gas, by using a pressure detecting part that produces a pressure measurement which does not change when mist contained in the processing gas adheres to the pressure detecting part, the pressure detecting part being disposed such that the mist may adhere to it, and
   detecting the quantity of mist contained in the processing gas based on a difference ΔP between the first pressure Pq detected by the first method and the second pressure Pg detected by the second method;
   performing a film forming process in the processing chamber while the detected quantity of mist remains below a threshold value; and
   either outputting a warning or stopping the film forming process when the quantity of mist exceeds the predetermined threshold value.

3. The film forming method as claimed in claim 1 or claim 2, wherein
   the first pressure Pq is detected by a first pressure gauge having an oscillator arranged in the gas to detect a pressure of the processing gas by change in an impedance of the oscillator in dependence on the pressure of the processing gas, and
   the second pressure Pg is detected by a second pressure gauge having its said pressure detecting part for receiving the pressure of the processing gas to detect the pressure of the processing gas based on a deformation of the pressure detecting part subjected to the pressure of the processing gas.

4. The film forming method as claimed in claim 3, wherein
   the first pressure gauge is a crystal gauge that includes a quartz oscillator forming the oscillator thereby detecting the first pressure Pq of the processing gas, and
   the second pressure gauge is a capacitance manometer that includes a diaphragm forming the pressure detecting part and electrodes opposing the diaphragm, the second pressure gauge detecting a deformation of the diaphragm in the form of a change in electrostatic capacity between the diaphragm and the electrodes to thereby detect the second pressure Pg of the processing gas.

5. The film forming method as claimed in claim 1 or claim 2, wherein the processing gas is an organic metallic compound used by a film forming apparatus.

* * * * *